United States Patent
Hashimoto et al.

(10) Patent No.: US 8,785,086 B2
(45) Date of Patent: Jul. 22, 2014

(54) REFLECTIVE MASK BLANK, METHOD OF MANUFACTURING THE SAME, AND REFLECTIVE MASK

(75) Inventors: Masahiro Hashimoto, Shinjuku-ku (JP); Kazunori Ono, Shinjuku-ku (JP); Kenta Tsukagoshi, Shinjuku-ku (JP); Tooru Fukui, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/812,627

(22) PCT Filed: Jul. 29, 2011

(86) PCT No.: PCT/JP2011/004321
§ 371 (c)(1),
(2), (4) Date: Jan. 28, 2013

(87) PCT Pub. No.: WO2012/014495
PCT Pub. Date: Feb. 2, 2012

(65) Prior Publication Data
US 2013/0122407 A1    May 16, 2013

(30) Foreign Application Priority Data

Jul. 30, 2010    (JP) ................................. 2010-172034

(51) Int. Cl.
*G03F 1/24*    (2012.01)

(52) U.S. Cl.
CPC ............... *G03F 1/24* (2013.01); *Y10S 430/143* (2013.01)

USPC ................................ 430/5; 430/296; 430/942

(58) Field of Classification Search
CPC .......................................................... G03F 1/24
USPC .............................................. 430/5, 296, 942
See application file for complete search history.

(56) References Cited

FOREIGN PATENT DOCUMENTS

| | | |
|---|---|---|
| JP | 7-333829 A | 12/1995 |
| JP | 8-213303 A | 8/1996 |
| JP | 9-22862 A | 1/1997 |
| JP | 6-177018 A | 6/1999 |
| JP | 2001-133967 A | 5/2001 |
| JP | 2009-147200 A | 7/2009 |

OTHER PUBLICATIONS

International Search Report for PCT/JP2011/004321 dated Nov. 1, 2011.

*Primary Examiner* — Christopher Young
(74) *Attorney, Agent, or Firm* — Sughrue Mion, PLLC

(57) ABSTRACT

To solve a problem of reduction in accumulated energy due to backward scattering, leading to degradation in CD linearity, which is caused when a generally used high-contrast resist is used in the manufacture of a reflective mask. A reflective mask blank for manufacturing a reflective mask includes a substrate, a multilayer reflective film which is formed on the substrate and adapted to reflect exposure light, and an absorber film which is formed on the multilayer reflective film and adapted to absorb the exposure light. A resist film for electron beam writing is formed on the absorber film and the contrast value γ of the resist film for electron beam writing is 30 or less.

20 Claims, 8 Drawing Sheets

REFLECTIVE MASK BLANK, METHOD OF MANUFACTURING THE SAME, AND REFLECTIVE MASK

CROSS REFERENCE TO RELATED APPLICATIONS

This application is a National Stage of International Application No. PCT/JP2011/004321 filed Jul. 29, 2011, claiming priority based on Japanese Patent Application No. 2010-172034 filed Jul. 30, 2010, the contents of all of which are incorporated herein by reference in their entirety.

TECHNICAL FIELD

This invention relates to a reflective mask blank, a method of manufacturing the same, and a reflective mask.

BACKGROUND ART

Generally, fine pattern formation is carried out by photolithography in manufacturing processes of a semiconductor device. A number of substrates called transfer masks are normally used for this fine pattern formation. The transfer mask comprises generally a transparent glass substrate having thereon a fine pattern made of a metal thin film or the like. An electron beam writing apparatus is used in the manufacture of the transfer mask. As a type of transfer mask, a halftone phase shift mask is known apart from a conventional binary mask having a light-shielding film pattern made of a chromium-based material or the like on a transparent substrate.

When carrying out exposure with high accuracy using the electron beam writing apparatus, part of an electron beam incident on a resist film collides with atoms forming the resist film so as to be forward-scattered while part of an electron beam transmitted through the resist film collides with atoms forming a substrate so as to be backward-scattered and is again incident on the resist film. Further, the backward-scattered electrons pass through the resist and are reflected inside the apparatus and again incident on the resist. Under the influence caused by the forward scattering, the backward scattering, and the like, there occurs a change in the line width of a pattern due to the aperture ratio. This is called a proximity effect phenomenon. As a method for solving this problem, it is known to perform proximity effect correction (hereinafter, PEC: Proximity Effect Correction) according to the pattern layout (exposure pattern density and arrangement).

In recent years, in order to form a fine pattern, a high-contrast chemically amplified resist film with a high γ value is used. For example, as shown on the upper side of FIG. 1, when a resist pattern is formed by carrying out electron beam exposure using a high-contrast chemically amplified resist with a high γ value on a Cr-based light-shielding film on a phase shift film in a halftone phase shift mask blank, the resist pattern which is high-contrast and sharp (pattern edge is vertical) is obtained and, for example, in the case of a 1:1 line-and-space pattern with a design size in the range of 500 nm to 70 nm, the CD linearity of the resist pattern is also excellent. In FIG. 1, Eth represents a minimum exposure dose at which the resist starts to be resolved.

In recent years, with higher integration of semiconductor devices, patterns finer than the transfer limit of the photolithography have been required in the semiconductor industry. In view of this, the EUV lithography being an exposure technique using extreme ultraviolet (Extreme Ultra Violet: hereinafter referred to as EUV) light with a shorter wavelength is expected to be promising. Herein, the EUV light represents light in a wavelength band of the soft X-ray region or the vacuum ultraviolet region and, specifically, light having a wavelength of about 0.2 to 100 nm. As a mask for use in the EUV lithography, there has been proposed, for example, an exposure reflective mask described in Patent Document 1 noted below.

This reflective mask has a multilayer reflective film formed on a substrate and adapted to reflect exposure light, a buffer film formed in a pattern on the multilayer reflective film, and further an absorber film formed in a pattern on the buffer film and adapted to absorb the exposure light. The buffer film is provided between the multilayer reflective film and the absorber film for the purpose of protecting the multilayer reflective film in pattern forming and correcting processes of the absorber film. The light incident on the reflective mask mounted in an exposure apparatus (pattern transfer apparatus) is absorbed at a portion where the absorber film is present, but is reflected by the multilayer reflective film at a portion where the absorber film is not present so that an optical image is transferred onto a semiconductor substrate through a reflective optical system.

Patent Document 1: JP-A-H8-213303

DISCLOSURE OF THE INVENTION

Problem to be Solved by the Invention

The present inventors have found that when a resist pattern is formed by carrying out electron beam exposure using a high-contrast chemically amplified resist with a high γ value on an absorber film in a reflective mask blank, more backward scattering occurs compared to the case where a resist pattern is formed by carrying out electron beam exposure using a high-contrast chemically amplified resist with a high γ value on a Cr-based light-shielding film in a halftone phase shift mask blank or a binary mask blank, and therefore that energy to be accumulated in the resist film decreases, leading to degradation in the contrast of accumulated energies particularly at a pattern edge portion (a section of the pattern is blurred to be trapezoidal in shape so that the slope of the edge portion increases) (see a diagram on the lower side of FIG. 1). The present inventors have found that one of main causes is that the thickness of a multilayer reflective film provided on the lower layer side of the resist film is large so that the influence of an electron beam which is backward-scattered by the multilayer reflective film and incident again on the resist film is large, and further have found that the absorber film as an underlayer of the resist film being tantalum (Ta) having a large atomic weight is also one cause.

When electron beam writing is carried out on the high-contrast chemically amplified resist film with the high γ value on the absorber film in the reflective mask blank, accumulated energy in the resist film largely differs depending on the difference in pattern size due to the above-mentioned backward scattering so that the minimum exposure dose Eth differs depending on the pattern size (see the diagram on the lower side of FIG. 1). Therefore, if patterning is carried out using the high-contrast resist, the CD linearity is degraded (see that the size of a second hole from the left in the diagram on the lower side of FIG. 1 is smaller than the size of a second hole from the left in a diagram on the upper side of FIG. 1). Further, compared to the case where the pattern of the high-contrast chemically amplified resist with the high γ value is formed on the Cr-based light-shielding film in the halftone phase shift mask blank, which is shown on the upper side of FIG. 1, the resolution performance (minimum resolution line width) is degraded (see that third to fifth holes from the left in the diagram on the lower side of FIG. 1 are not resolved).

This invention has been made under these circumstances and has an object to provide a reflective mask blank that can solve a problem of reduction in accumulated energy due to backward scattering, leading to degradation in CD linearity, which is caused when a generally used high-contrast resist is used in the manufacture of a reflective mask, and to provide a manufacturing method thereof and a reflective mask.

Means for Solving the Problem

This invention has the following structures.
(Structure 1)
A reflective mask blank for manufacturing a reflective mask, comprising:
a substrate;
a multilayer reflective film which is formed on the substrate and adapted to reflect exposure light;
an absorber film which is formed on the multilayer reflective film and adapted to absorb the exposure light; and
a resist film for electron beam writing which is formed on the absorber film;
wherein a contrast value γ of the resist film is 30 or less.
(Structure 2)
A reflective mask blank for manufacturing a reflective mask, comprising:
a substrate;
a multilayer reflective film which is formed on the substrate and adapted to reflect exposure light;
an absorber film which is formed on the multilayer reflective film and adapted to absorb the exposure light; and
a resist film for electron beam writing which is formed on the absorber film;
wherein an exposure latitude of the resist film is 0.7 nm/% dose or less.
(Structure 3)
The reflective mask blank according to structure 1 or 2, wherein the contrast value γ of the resist film is 25 or less.
(Structure 4)
The reflective mask blank according to any one of structures 1 to 3, wherein the reflective mask blank is used in EUV lithography which uses EUV light as exposure light.
(Structure 5)
The reflective mask blank according to any one of structures 1 to 4, wherein the absorber film is made of a material containing tantalum.
(Structure 6)
The reflective mask blank according to any one of structures 1 to 5, wherein the number of layers of the multilayer reflective film is 10 cycles or more.
(Structure 7)
The reflective mask blank according to any one of structures 1 to 6, wherein the resist film is made of a chemically amplified resist.
(Structure 8)
A method of manufacturing a reflective mask, comprising the steps of:
preparing a reflective mask blank for manufacturing a reflective mask, the reflective mask blank comprising a substrate, a multilayer reflective film which is formed on the substrate and adapted to reflect exposure light, and an absorber film which is formed on the multilayer reflective film and adapted to absorb the exposure light;
forming a resist film for electron beam writing on the absorber film, the resist film having a contrast value γ of 30 or less; and
forming a resist pattern by the electron beam writing.
(Structure 9)
A method of manufacturing a reflective mask, comprising the steps of:
preparing a reflective mask blank for manufacturing a reflective mask, the reflective mask blank comprising a substrate, a multilayer reflective film which is formed on the substrate and adapted to reflect exposure light, and an absorber film which is formed on the multilayer reflective film and adapted to absorb the exposure light;
forming a resist film for electron beam writing on the absorber film, the resist film having an exposure latitude of 0.7 nm/% dose or less; and
forming a resist pattern by the electron beam writing.
(Structure 10)
The method of manufacturing a reflective mask according to structure 8 or 9, wherein the contrast value γ of the resist film is 25 or less.
(Structure 11)
The method of manufacturing a reflective mask according to any one of structures 8 to 10, wherein exposure is carried out at an acceleration voltage of an electron beam being 50 keV or more in the electron beam writing.
(Structure 12)
A reflective mask manufactured by using the mask blank according to any one of structures 1 to 7 and patterning the absorber film.

Effect of the Invention

According to this invention, it is possible to provide a reflective mask blank that can solve a problem of reduction in accumulated energy due to backward scattering, leading to degradation in CD linearity, which is caused when a generally used high-contrast resist is used in the manufacture of a reflective mask, and to provide a manufacturing method thereof and a reflective mask.

Hereinbelow, this invention will be described in detail.

According to this invention, there is provided a reflective mask blank for manufacturing a reflective mask, comprising:

a substrate;

a multilayer reflective film which is formed on the substrate and adapted to reflect exposure light;

an absorber film which is formed on the multilayer reflective film and adapted to absorb the exposure light; and a resist film for electron beam writing which is formed on the absorber film;

wherein a contrast value γ of the resist film is 30 or less (Structure 1).

As described above, if the resist for electron beam writing with lower contrast compared to a resist for electron beam writing which is used in a general halftone phase shift mask blank or binary mask blank is employed, it is possible to give latitude to the exposure sensitivity and, therefore, even if accumulated energy decreases due to backward scattering, the CD linearity can be made excellent.

Figure 1:
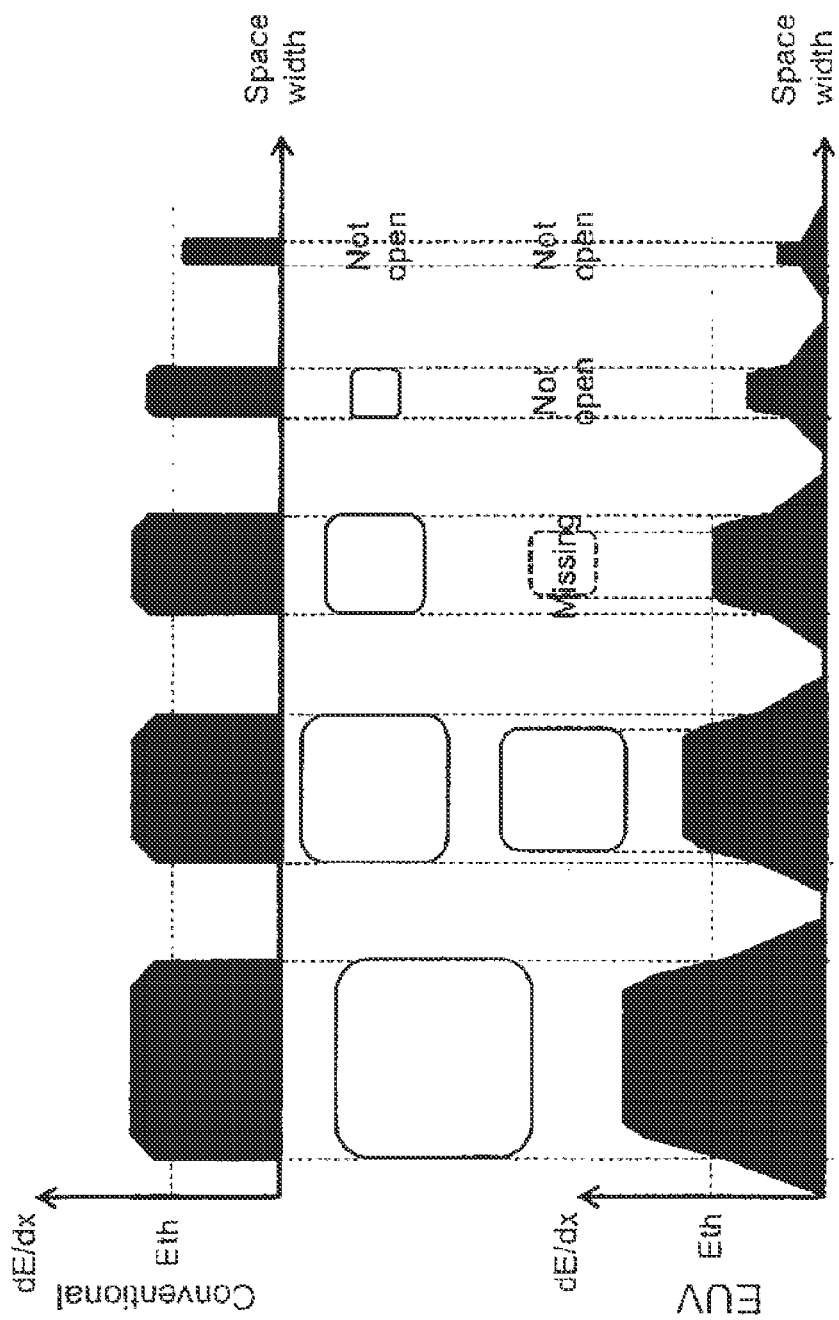
FIG. 1 is an exemplary sectional view showing a state where resist patterns with different sizes are formed on each of a binary mask blank and a reflective mask blank using a relatively high-contrast chemically amplified resist.
Figure 2:
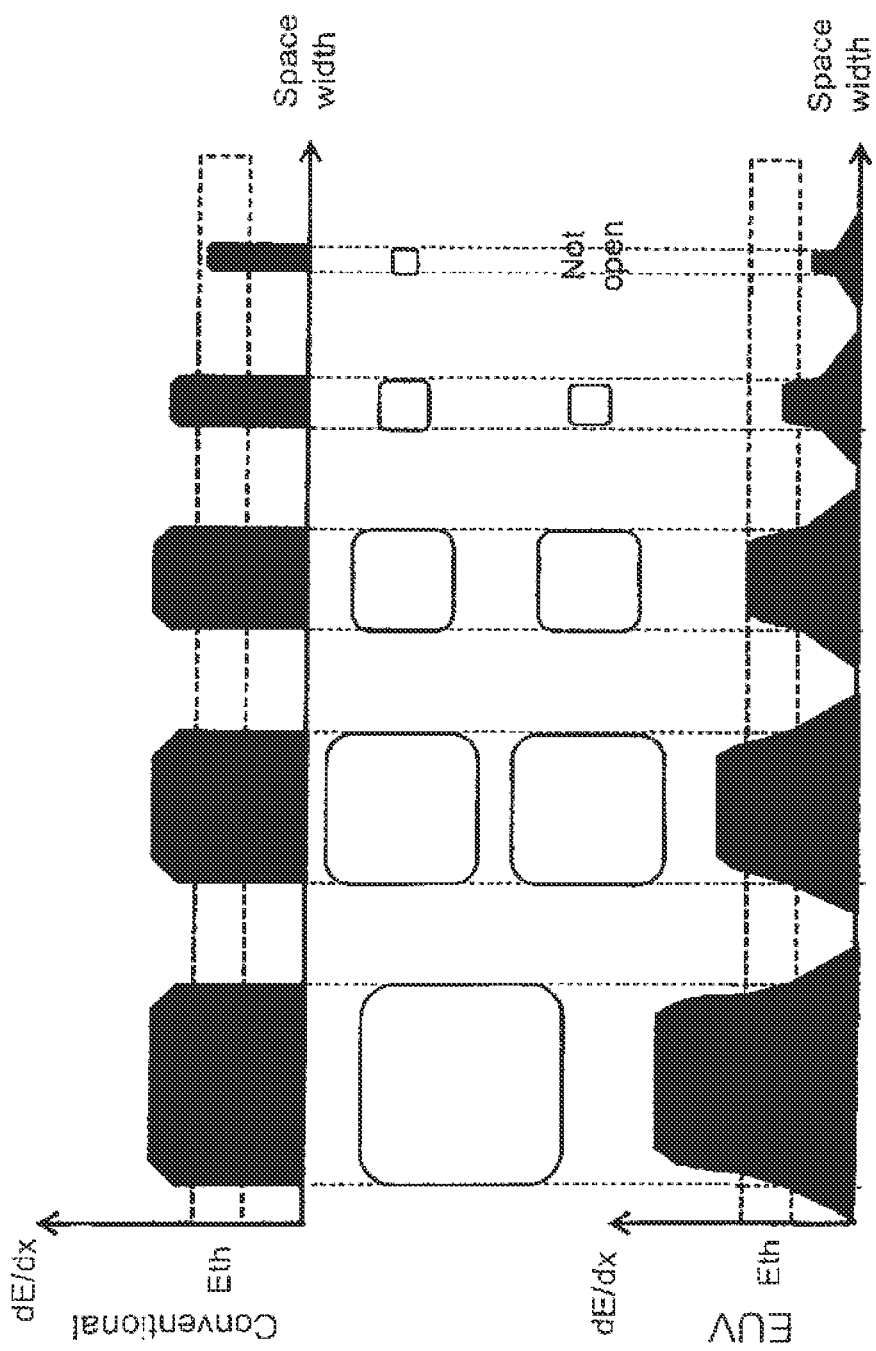
FIG. 2 is an exemplary sectional view showing a state where resist patterns with different sizes are formed on each of a binary mask blank and a reflective mask blank using a chemically amplified resist designed to be low-contrast.

Specifically, compared to the case of a diagram shown on the lower side of FIG. 1, i.e. compared to the case where electron beam exposure is carried out to form a resist pattern, using a high-contrast chemically amplified resist with a high γ value which is generally used for aiming at high contrast and high resolution, on an absorber film in a reflective mask blank, in the case of a diagram shown on the lower side of FIG. 2 as in the invention of this application, i.e. in the case where electron beam exposure is carried out to form a resist pattern, using a chemically amplified resist which is intentionally designed and manufactured so as to be small in γ value and thus low-contrast, on an absorber film in a reflective mask blank, the CD linearity becomes excellent (see that while the size of a second hole from the left in the diagram on the lower side of FIG. 1 is smaller than the size of a second hole from the left in a diagram on the upper side of FIG. 1, the sizes of second to fourth holes from the left in the diagram on the lower side of FIG. 2 are equal to the sizes (substantially corresponding to the design sizes) of second to fourth holes from the left in a diagram on the upper side of FIG. 2 so that the CD linearity is excellent).

Further, compared to the case of the diagram shown on the lower side of FIG. 1, i.e. compared to the case where the electron beam exposure is carried out to form the resist pattern, using the high-contrast chemically amplified resist with the high γ value which is generally used for aiming at high contrast and high resolution, on the absorber film in the reflective mask blank, the resolution performance (minimum resolution line width) is improved in the invention of this application (see that the third and fourth holes from the left in the diagram on the lower side of FIG. 2 are resolved).

In general, a sensitivity curve is produced from the relationship between the irradiation energy amount E and the film thickness. The film thickness is obtained by normalizing a film thickness d after development by a coating film thickness d0 and is given by a remaining film ratio d/d0 while E is normally given by an energy amount E per unit area. The abscissa axis represents log 10E.

In the case of a positive resist, the sensitivity curve is a graph in which the normalized film thickness is given assuming that the film thickness of a non-exposed portion after development is 100%. In the case of a negative resist, the film thickness of a portion exposed with an exposure dose which is sufficiently greater than an optimum exposure dose for pattern formation is set to 100%.

The γ value can be calculated from the slope of the sensitivity curve.

In the case of the positive resist, the γ value is defined by the slope between 0 (D0) and 80% (D80) of the normalized film thickness.

In the case of the positive resist, the γ value is given by γ=0.8/log 10(D0/D80).

As the γ value increases, the slope of the sensitivity curve approaches vertical and the contrast becomes higher.

If the γ value is too low, it adversely affects edge roughness and CD distribution of a resist pattern. In terms of avoiding this, the γ value is preferably 10 or more.

In the case of the negative resist, the γ value is given by γ=0.2/log 10(D70/D50).

The γ value does not affect the sensitivity.

In this invention, a resist with a γ value of 30 or less that allows the CD linearity of a resist pattern in the case of a 1:1 line-and-space pattern with a design size in the range of 500 nm to 100 nm to achieve 4.8 nm or less which is required for the DRAM hp (half pitch) 32 nm generation of the design rule is intentionally designed, manufactured, and used in the manufacture of a reflective mask. Further, a resist with a γ value of 25 or less that allows the CD linearity of a resist pattern in the case of a 1:1 line-and-space pattern with a design size in the range of 500 nm to 70 nm to achieve 3.4 nm or less which is required for the DRAM hp23 nm generation of the design rule is more preferable (Structure 3). The γ value is more preferably 20 or less.

Specifically, when electron beam exposure is carried out to form a resist pattern, using a high-contrast chemically amplified resist with a high γ value which is generally used for aiming at high contrast and high resolution, on an absorber film in a reflective mask blank, more backward scattering occurs compared to the case where electron beam exposure is carried out on a resist film on a Cr-based light-shielding film in a halftone phase shift mask blank or a binary mask blank. Consequently, energy to be accumulated in the resist film decreases, leading to degradation in the contrast of accumulated energies particularly at a pattern edge portion, which causes degradation in the CD linearity of the resist pattern. In order to solve this problem, in the invention of this application, electron beam exposure is carried out to form a resist pattern, using a chemically amplified resist which is intentionally designed and manufactured so as to be small in γ value and thus low-contrast, on an absorber film in a reflective mask blank.

A chemically amplified resist has a feature that it is high in γ value and thus high-contrast (a sensitivity curve is close to vertical and thus latitude of exposure sensitivity is very small). In this invention, the above-mentioned problem is solved by carrying out electron beam exposure to form a resist pattern using a chemically amplified resist which is boldly designed and manufactured so as to be small in γ value and thus low-contrast (the slope of a sensitivity curve is made gentle to give latitude to exposure sensitivity).

According to this invention, there is provided a reflective mask blank for manufacturing a reflective mask, comprising:

a substrate;

a multilayer reflective film which is formed on the substrate and adapted to reflect exposure light;

an absorber film which is formed on the multilayer reflective film and adapted to absorb the exposure light; and a resist film for electron beam writing which is formed on the absorber film;

wherein an exposure latitude of the resist film is 0.7 nm/% dose or less (Structure 2).

Herein, the exposure latitude EL (Exposure Latitude) represents a change in CD in nm when the dose is changed by 1% with respect to a dose with which normal design CD is obtained. In a dose-CD graph with the abscissa axis representing the dose and the ordinate axis representing the CD, when a hole pattern is formed in a positive resist, a curve rising to the right is obtained such that the CD increases as the dose increases while the CD decreases as the dose decreases. The exposure latitude EL is given by the slope of this curve.

The exposure latitude EL is preferably 0.7 nm/% dose or less. On the other hand, the exposure latitude EL is preferably 0.5 nm/% dose or more for proximity effect correction.

As will be described later, there is a tendency that as the contrast value γ of the resist for electron beam writing decreases, the value of the exposure latitude EL also decreases. Therefore, when the exposure latitude EL is in the above-mentioned range, even if accumulated energy decreases due to backward scattering, the CD linearity can be made excellent like in the Structure 1.

This invention includes a case where the resist for electron beam writing has the contrast value γ of 30 or less and the exposure latitude of 0.7 nm/% dose or less.

The exposure latitude EL does not affect the sensitivity.

According to this invention, the aforementioned reflective mask blank comprises a reflective mask blank which is used in EUV lithography which uses EUV light as exposure light (Structure 4).

As described above, in the reflective mask blank for use in the EUV lithography, the influence of the light which is backward-scattered by the multilayer reflective film and incident again on the resist film is large, and therefore, the subject of this application becomes particularly significant.

A reflective mask which is manufactured using the reflective mask blank of this invention is particularly suitable for the EUV lithography which uses EUV light (wavelength: about 0.2 to 100 nm) as exposure light, but it is also properly applicable to other short-wavelength exposure light.

According to this invention, the absorber film may be made of a material containing tantalum (Structure 5).

As described above, in the reflective mask blank for use in the EUV lithography, the influence of the light which is backward-scattered due to the fact that the absorber film as an underlayer of the resist film is tantalum (Ta) having a larger atomic weight than Cr and Mo and which is incident again on the resist film is also considered to be one cause, and therefore, the subject of this application becomes significant.

Material and so on of the absorber film will be described later.

According to this invention, the number of layers of the aforementioned multilayer reflective film may be 10 cycles or more (Structure 6).

If the number of layers of the multilayer reflective film is 10 cycles (10 pairs) or more, the subject of this application becomes particularly significant.

In terms of reflectance, the number of layers of the multilayer reflective film is preferably 40 to 60 cycles (pairs). The thickness of the multilayer reflective film is preferably, for example, 280 to 420 nm.

Material and so on of the multilayer reflective film will be described later.

According to this invention, the resist film may be made of a chemically amplified resist (Structure 7).

As described above, in order to form a fine pattern, a high-contrast chemically amplified resist film for electron beam writing with a high γ value is used. In this case, the subject of this application becomes particularly significant.

The thickness of the resist film is preferably 50 to 200 nm and more preferably 100 to 150 nm.

In the case of a non-chemically amplified resist, it is possible to carry out exposure at 50 keV or more (writing with a proper dose) and therefore a high-contrast resist is difficult to obtain. This is because high contrast is difficult to obtain unless a resist is a chemically amplified resist. In the case of a photoresist, the problem of backward scattering of an electron beam does not arise.

According to this invention, there is provided a method of manufacturing a reflective mask, comprising the steps of:

preparing a reflective mask blank for manufacturing a reflective mask, the reflective mask blank comprising a substrate, a multilayer reflective film which is formed on the substrate and adapted to reflect exposure light, and an absorber film which is formed on the multilayer reflective film and adapted to absorb the exposure light;

forming a resist film for electron beam writing on the absorber film, the resist film having a contrast value γ of 30 or less; and forming a resist pattern by the electron beam writing (Structure 8).

With this structure, the same effect as described above is obtained.

According to this invention, there is provided a method of manufacturing a reflective mask, comprising the steps of:

preparing a reflective mask blank for manufacturing a reflective mask, the reflective mask blank comprising a substrate, a multilayer reflective film which is formed on the substrate and adapted to reflect exposure light, and an absorber film which is formed on the multilayer reflective film and adapted to absorb the exposure light;

forming a resist film for electron beam writing on the absorber film, the resist film having an exposure latitude of 0.7 nm/% dose or less; and forming a resist pattern by the electron beam writing (Structure 9).

With this structure, the same effect as described above is obtained.

According to this invention, the contrast value γ of the resist film may be 25 or less (Structure 10).

With the resist film with lower contrast, the CD linearity can be made more excellent.

According to this invention, exposure may be carried out at an acceleration voltage of an electron beam being 50 keV or more in the electron beam writing (Structure 11).

As the acceleration voltage increases, backward scattering increases. When the acceleration voltage of the electron beam is 50 keV or more, the subject of this application becomes particularly significant.

According to this invention, the reflective mask is manufactured by using the mask blank according to any one of structures 1 to 7 and patterning the absorber film (Structure 12).

As reflective masks of this invention, the following aspects are given.

(1) A reflective mask in which a buffer film is formed on a multilayer reflective film formed on a substrate and an absorber film pattern in the form of a predetermined transfer pattern is formed on the buffer film (reflective mask of the type in which the buffer film is not patterned).

(2) A reflective mask in which a pattern of a buffer film and an absorber film in the form of a predetermined transfer pattern is formed on a multilayer reflective film formed on a substrate (reflective mask of the type in which the buffer film is patterned).

(3) A reflective mask in which an absorber film pattern in the form of a predetermined transfer pattern is formed on a multilayer reflective film formed on a substrate (reflective mask of the type with no buffer film).

In this invention, the multilayer reflective film is a multilayer film in which elements with different refractive indices are periodically laminated and, in general, use is made of a multilayer film in which thin films of a heavy element or its compound and thin films of a light element or its compound are alternately laminated by about 40 to 60 cycles.

For example, as a multilayer reflective film for EUV light having a wavelength of 13 to 14 nm, use is preferably made of a Mo/Si cycle laminated film in which Mo films and Si films are alternately laminated by about 40 cycles. As other multilayer reflective films for use in the region of the EUV light, there are a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, and the like. The material may be properly selected according to the exposure wavelength.

In this invention, the multilayer reflective film can be formed by depositing each layer by DC magnetron sputtering, ion beam sputtering, or the like. In the case of the above-mentioned Mo/Si cycle multilayer film, using, for example, the ion beam sputtering, a Si target is first used to form a Si film having a thickness of about several nm, then a Mo target is used to form a Mo film having a thickness of about several nm and, given that this forms one cycle, Si and Mo films are laminated by 40 to 60 cycles and, finally, a Si film is formed.

In this invention, a protective film made of a material such as, for example, ruthenium (Ru), its compound, or the like may be provided between the multilayer reflective film and the buffer film or between the multilayer reflective film and the absorber film (in the case of having no buffer film). With this protective film, the multilayer reflective film is prevented from being damaged due to etching during pattern formation of the buffer film or the absorber film so that it is possible to prevent a reduction in exposure light reflectance. As the ruthenium compound, RuNb, RuZr, or the like can be given, for example.

In this invention, a buffer film having etching characteristics different from those of the absorber film may be formed between the multilayer reflective film and the absorber film. By forming such a buffer film, the multilayer reflective film is prevented from being damaged due to etching during pattern formation and pattern correction of the absorber film. In particular, high smoothness can be obtained with the buffer film made of a chromium-based material containing chromium and therefore a surface of the absorber film formed thereon can also obtain high smoothness so that pattern blur can be reduced.

In this invention, as a material of the chromium-based buffer film, particularly a material containing a nitride of chromium (Cr) is preferably given. The buffer film preferably has a film density of 5.0 to 9.0 g/cm3. Since the buffer film containing the nitride of chromium has the film density of 5.0 to 9.0 g/cm3, the absorption effect of the buffer film for the EUV light is enhanced so that it is possible to reduce the thickness of the absorber film. As a consequence, there is exhibited an effect that can reduce an increase in pattern line width when a pattern is transferred to a transfer target, which is otherwise caused by the shadowing effect.

In this invention, the buffer film can be formed on the multilayer reflective film by sputtering such as ion beam sputtering other than DC sputtering or RF sputtering.

When performing correction of the absorber film pattern using, for example, a focused ion beam (FIB), the thickness of the buffer film is preferably set to about 20 to 60 nm, but when the FIB is not used, it can be set to about 5 to 15 nm.

In this invention, the absorber film may be satisfactory as long as it has a function of absorbing, for example, the EUV light as the exposure light.

As described above, this invention includes the case where the absorber film is made of the material containing tantalum.

As the material containing tantalum, particularly Ta alone or a material composed mainly of Ta can be preferably used. The material composed mainly of Ta is, for example, an alloy of Ta. The crystalline state of such an absorber film preferably has an amorphous or microcrystalline structure in terms of smoothness and flatness.

As the material composed mainly of Ta, it is possible to suitably use, for example, a material containing Ta and B, a material containing Ta and N, a material containing Ta and B and further containing at least one of O and N, or the like. By adding, for example, B to Ta, an amorphous material can be easily obtained to improve the smoothness. On the other hand, by adding N or O to Ta, the resistance to oxidation is improved and therefore there is obtained an effect of improving the temporal stability.

The absorber film is required to have a thickness that can sufficiently ensure the light-shielding ability with respect to the EUV light as the exposure light, and it is normally about 30 to 100 nm.

In a more preferred embodiment of a reflective mask blank of this invention, the absorber film has a laminated structure comprising an uppermost layer and a lower layer other than the uppermost layer, wherein the uppermost layer is formed of a material containing one of an oxide, a nitride, an oxynitride, and a carbide of tantalum (Ta) and has a film density of 6.0 to 11.0 g/cm3 and the lower layer is formed of a material containing tantalum (Ta) and has a film density of 11.0 to 16.0 g/cm3.

According to the reflective mask blank of the more preferred embodiment of this invention, there are obtained a reflective mask blank having the following effects and a reflective mask manufactured using such a reflective mask blank.

(1) That is, an absorber film has a laminated structure comprising an uppermost layer and a lower layer other than the uppermost layer, wherein the uppermost layer is formed of a material containing one of an oxide, a nitride, an oxynitride, and a carbide of tantalum (Ta) and a selection is made of the material of which the film density is low to allow easy transmission of the EUV exposure light therethrough and wherein the lower layer is formed of a material containing tantalum (Ta) and a selection is made of the material of which the film density is particularly high. This makes it possible to suppress the surface reflection for the EUV exposure light with the uppermost layer while ensuring sufficient light-shielding performance for the EUV exposure light mainly with the lower layer. As a consequence, it is possible to obtain a reflective mask of which the mask contrast for the EUV exposure light is improved.

That is, it is possible to suppress the surface reflection by enhancing the exposure light transmittance in the uppermost layer in use of the mask and to improve the mask contrast for the EUV light as the exposure light, so that a fine pattern can be transferred with high accuracy.

(2) By setting the film density of the uppermost layer to be lower than that of the lower layer to enhance the EUV exposure light transmittance in the uppermost layer, it is possible to increase the interference effect between the exposure light transmitted through the uppermost layer and reflected by the lower layer and the exposure light reflected by the multilayer reflective film so that it is possible to produce the phase shift effect at a pattern edge portion of the absorber film to thereby improve the pattern resolution at the pattern edge portion. As a result, it is possible to obtain a reflective mask that can achieve high-resolution pattern transfer.

The uppermost layer of the absorber film in this invention is formed of the material containing one of the oxide, the nitride, the oxynitride, and the carbide of tantalum (Ta) and has the film density of 6.0 to 11.0 g/cm3. Particularly preferably, the film density is in the range of 7.0 to 9.0 g/cm3. If the film density is less than 6.0 g/cm3, there arises a problem that the contrast cannot be ensured because the reflection at the interface with the lower layer becomes strong and the EUV light can hardly be absorbed. On the other hand, if the film density is higher than 11.0 g/cm3, there arises a problem that the transmittance for the EUV exposure light becomes low, thus reducing the effect of suppressing the surface reflection for the exposure light with the uppermost layer.

As typical compound examples of the oxide, the nitride, the oxynitride, and the carbide of Ta, TaO, TaON, TaN, TaCN, TaC, and the like can be given, for example. The material forming the uppermost layer of the absorber film may further contain boron (B). By containing B, it is possible to further improve the amorphous properties and the surface smoothness of the film. As typical compound examples, TaBO, TaBON, TaBC, TaBCN, and the like can be given, for example.

Any of the single-layer absorber film and the uppermost and lower layers of the laminated-structure absorber film does not necessarily have a uniform composition over its entirety and, for example, each may have a composition gradient so that the composition changes in a thickness direction of the film. In the composition gradient, the composition of contained elements may change continuously or stepwise.

In this invention, in order to prevent pattern deformation due to heat during exposure, the substrate preferably has a low thermal expansion coefficient in the range of 0±1.0×10−7/° C. and more preferably in the range of 0±0.3×10−7/° C. As a material having a low thermal expansion coefficient in this range, it is possible to use any of an amorphous glass, a ceramic, and a metal. For example, use can be made of a SiO2—TiO2-based glass or a quartz glass in the case of an amorphous glass or of a crystallized glass precipitated with p-quartz solid solution or the like in the case of a crystallized glass. As an example of a metal substrate, an Invar alloy (Fe—Ni-based alloy) or the like can be given. It is also possible to use a single-crystal silicon substrate.

In this invention, in order to obtain high reflectance and high transfer accuracy, the substrate preferably has high smoothness and flatness. In particular, the substrate preferably has a surface with a smoothness of 0.2 nm or less in Rms (smoothness in a 10 μm square area) and a flatness of 100 nm or less (flatness in a 142 mm square area). Further, the substrate preferably has high rigidity in order to prevent deformation thereof due to the film stress of a film to be formed thereon. In particular, the substrate preferably has a high Young's modulus of 65 GPa or more.

The unit Rms representing the smoothness is a root mean square roughness which can be measured by an atomic force microscope. The flatness is a value representing a warp (deformation amount) of a surface given by TIR (Total Indicated Reading) and, assuming that a plane determined by the method of least squares on the basis of a substrate surface is given as a focal plane, the flatness is an absolute value of a height difference between the highest position of the substrate surface located above the focal plane and the lowest position of the substrate surface located below the focal plane.

Next, an embodiment will be described.

Figure 8:
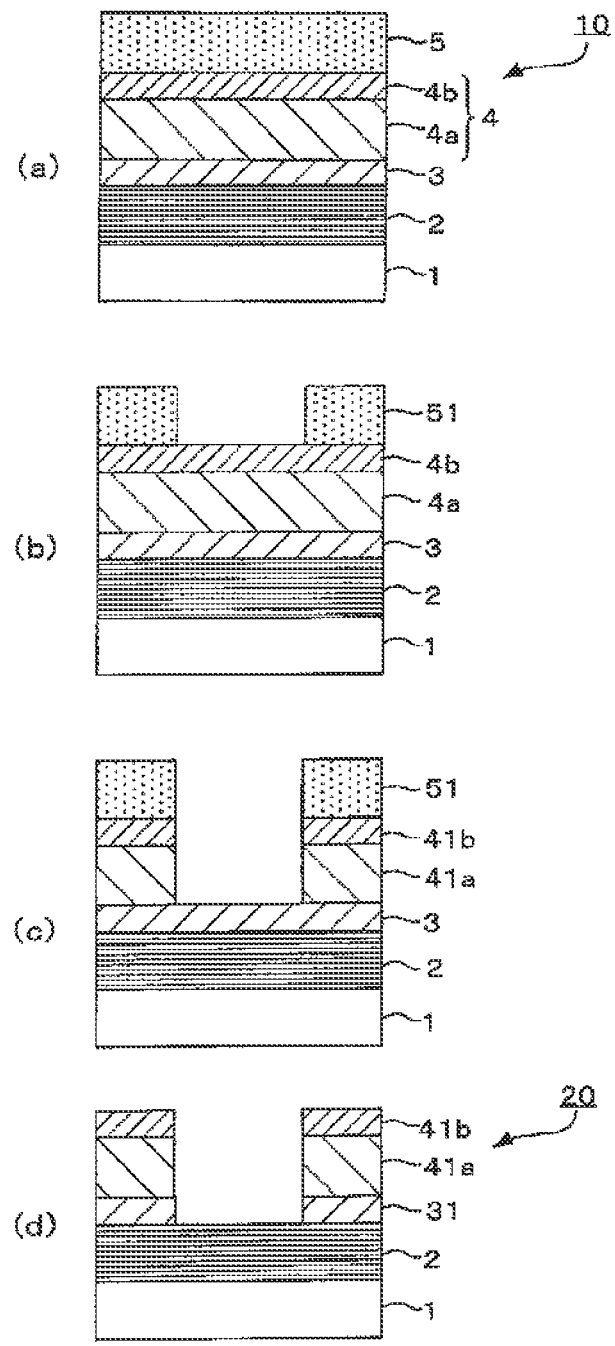
FIG. 8 is exemplary sectional views showing processes of manufacturing a reflective mask from a reflective mask blank.

FIG. 8 is schematic sectional views showing a reflective mask blank according to an embodiment of this invention and showing processes of manufacturing a reflective mask using this mask blank.

As shown in FIG. 8(a), the reflective mask blank according to the embodiment of this invention has a structure in which a multilayer reflective film 2 is formed on a substrate 1, and a buffer film 3 and an absorber film 4 having a laminated structure of a lower layer 4a and an uppermost layer 4b are formed on the multilayer reflective film 2. Further, a resist film 5 is provided on an upper surface of the absorber film 4.

In the embodiment shown in FIG. 8, the reflective mask blank 10 is configured as described above and thus has the buffer film. However, according to a method of forming a pattern of the absorber film 4 or a method of correcting the formed pattern, the reflective mask blank 10 may be configured such that the buffer film is not provided.

Next, a description will be given of the processes of manufacturing a reflective mask using the reflective mask blank 10. The materials and the forming methods of the respective layers of the reflective mask blank 10 (see FIG. 8(a)) are as described above.

A predetermined transfer pattern is formed in the absorber film 4 of the reflective mask blank 10. First, the resist film 5 on the absorber film 4 is subjected to predetermined pattern writing by the use of an electron beam writing apparatus and then to development, thereby forming a predetermined resist pattern 51 (see FIG. 8(b)).

Using the formed resist pattern 51 as a mask, the uppermost layer 4b and the lower layer 4a of the absorber film 4 are dry-etched to thereby form an absorber film pattern (laminated pattern of an uppermost layer pattern 41b and a lower layer pattern 41a) in the form of the predetermined transfer pattern (see FIG. 8(c)). In the case where the uppermost layer 4b and the lower layer 4a of the absorber film 4 are each made of a material composed mainly of Ta, use can be made of dry etching using a chlorine gas or a fluorine-based gas.

The resist pattern 51 remaining on the uppermost layer pattern 41b is removed by oxygen plasma ashing, ozone water, or the like.

Normally, an inspection is carried out herein to check whether or not the absorber film pattern (laminated pattern of the lower layer pattern 41a and the uppermost layer pattern 41b) is formed as designed. The inspection is carried out by causing inspection light for use in pattern inspection to be incident on a mask formed with the absorber film pattern and detecting the inspection light reflected by the uppermost layer pattern 41b and the inspection light reflected by the buffer film 3 exposed due to the removal of the absorber film 4 to thereby observe the contrast therebetween.

If, as a result thereof, there is detected, for example, a pinhole defect (white defect) formed by the removal of the absorber film 4 at a portion that should not be removed or an etching insufficient defect (black defect) where part of the absorber film 4 is not removed and thus remains due to insufficient etching, correction thereof is carried out.

For correcting the pinhole defect, there is, for example, a method of depositing a carbon film or the like in a pinhole by FIB-assisted deposition. On the other hand, for correcting the etching insufficient defect, there is, for example, a method of removing an unnecessary portion by FIB irradiation. In this event, the buffer film 3 serves as a protective film for protecting the multilayer reflective film 2 against the FIB irradiation.

After the pattern inspection and correction have been finished as described above, the exposed buffer film 3 is removed according to the absorber film pattern so as to be formed into a pattern 31, thereby manufacturing a reflective mask 20 (see FIG. 8(d)). Herein, for example, in the case where the buffer film is made of a Cr-based material, use can be made of dry etching using a mixed gas containing chlorine and oxygen. At a portion where the buffer film is removed, the multilayer reflective film 2 as a reflection area for the exposure light is exposed.

If the required reflectance can be obtained without removing the buffer film, the buffer film may be left on the multilayer reflective film without being processed into the same pattern as that of the absorber film.

Lastly, an inspection is carried out to finally confirm whether or not the absorber film pattern is formed with dimensional accuracy according to a specification.

EXAMPLE

Hereinbelow, this invention will be described in further detail with reference to an Example.

(Manufacture of Reflective Mask Blank)

A substrate to be used was a SiO2—TiO2-based glass substrate (6-inch square, thickness 6.3 mm). This substrate had a thermal expansion coefficient of $0.2 \times 10-7/°$ C. and a Young's modulus of 67 GPa. Then, this glass substrate was mechanically polished so as to have a surface with a smoothness of 0.2 nm or less in Rms and a flatness of 100 nm or less.

As a multilayer reflective film to be formed on the substrate, a Mo film/Si film cycle multilayer reflective film was employed so as to obtain the multilayer reflective film suitable for an exposure light wavelength band of 13 to 14 nm. That is, the multilayer reflective film was formed by using a Mo target and a Si target and alternately laminating films on the substrate by ion beam sputtering. A Si film was formed to 4.2 nm and a Mo film was formed to 2.8 nm and, given that this formed one cycle, films were laminated by 40 cycles, then a Si film was formed to 4.2 nm, and further thereon, a Ru film was formed to 2.5 nm as a protective film.

In this manner, a multilayer reflective film coated substrate was obtained. Reflectance was measured by applying EUV light of 13.5 nm to the multilayer reflective film at an incident angle of 6.0 degrees and it was 63%.

Then, a buffer film was formed on the protective film of the multilayer reflective film coated substrate thus obtained. As the buffer film, a chromium nitride film was formed to a thickness of 20 nm. The buffer film was formed by DC magnetron sputtering using a Cr target and using a mixed gas of argon (Ar) and nitrogen (N2) as a sputtering gas. In the formed CrNx film, nitrogen (N) was 10 at % (x=0.1). The formed CrNx film had a film density of 7.0 g/cm3. The film density was measured by the low-angle EUV reflected light intensity measurement.

Then, on the buffer film, a material containing Ta, B, and N was deposited to a thickness of 50 nm as a lower layer of an absorber film. That is, the lower layer was formed by DC magnetron sputtering using a target containing Ta and B and adding nitrogen (N2) in an amount of 10% to argon (Ar). The composition ratio of the formed TaBN film was such that Ta was 59 at %, B was 21 at %, and N was 20 at %.

Subsequently, a material containing Ta, B, and O was deposited to a thickness of 20 nm as an upper layer of the absorber film. That is, the upper layer was formed by DC magnetron sputtering using a target containing Ta and B and adding oxygen (O2) in an amount of 10% to argon (Ar). The composition ratio of the formed TaBO film was such that Ta was 43 at %, B was 8 at %, and O was 49 at %.

The formed TaBN film (lower layer) had a film density of 13.5 g/cm3 while the formed TaBO film (uppermost layer) had a film density of 9.2 g/cm3. The film density was measured by the above-mentioned method.

Transmittance was measured by applying EUV light of 13.5 nm to the TaBO film as the uppermost layer at an incident angle of 6.0 degrees and it was 0.8%.

In the manner described above, a plurality of reflective mask blanks were manufactured.

Then, resist films A to E for electron beam writing given below were respectively formed on the reflective mask blanks thus obtained. The thickness of the resist films A to E was set to 100 nm. The resist film coated reflective mask blanks thus obtained were subjected to predetermined pattern writing by the use of an electron beam writing apparatus and then to development after the pattern writing, thereby forming resist patterns. The acceleration voltage of an electron beam was set to 50 keV.

chemically amplified resist A: contrast value γ=80
chemically amplified resist B: contrast value γ=33
chemically amplified resist C: contrast value γ=27
chemically amplified resist D: contrast value γ=12
chemically amplified resist E: contrast value γ=11

(Evaluation)

Figure 3:
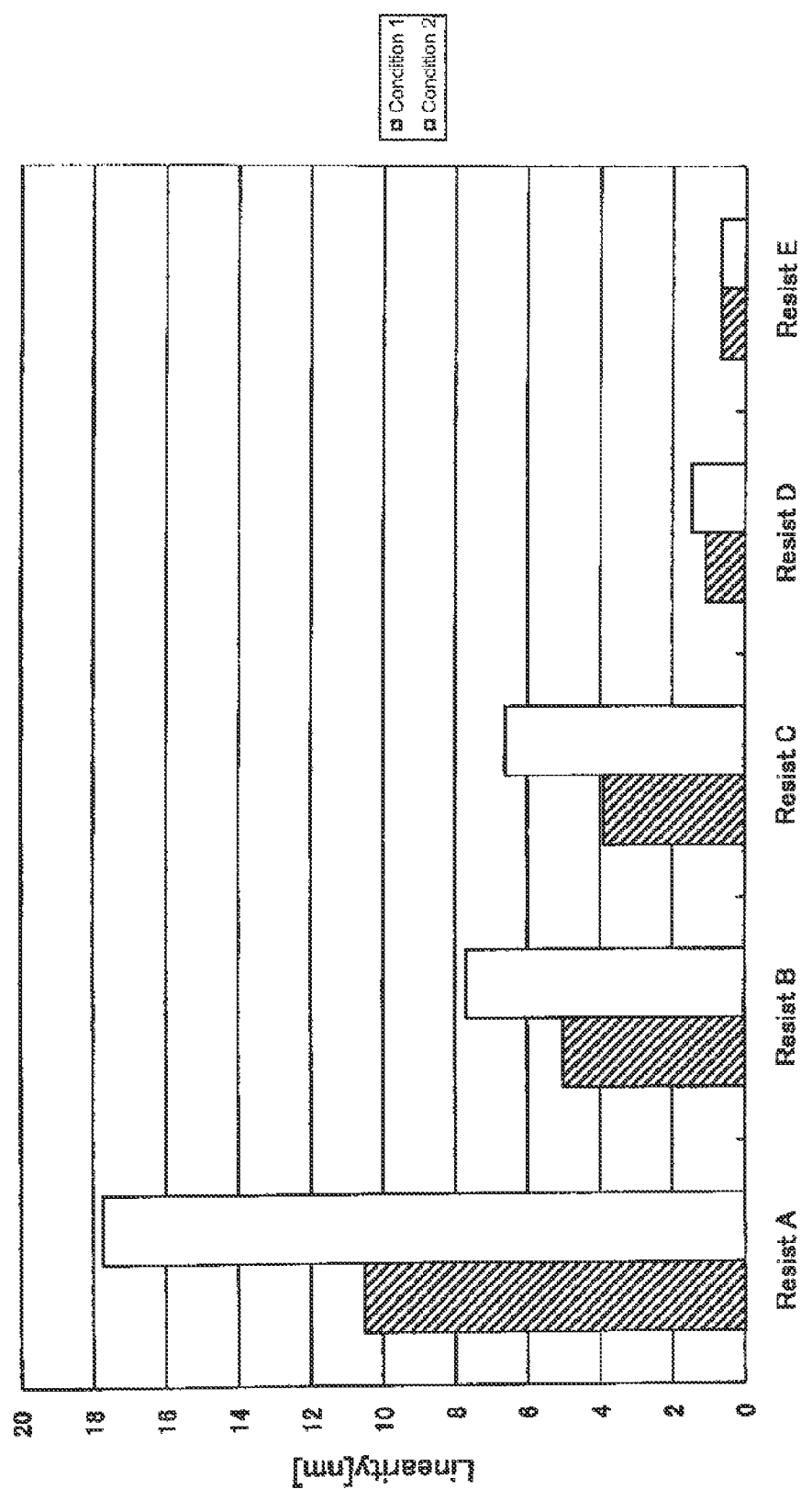
FIG. 3 is a diagram showing the CD linearity of chemically amplified resists A, B, C, D, and E each on a reflective mask blank.

FIG. 3 shows the CD linearity of line-and-space (L&S) resist patterns.

In FIG. 3, left-side bars for the respective resists (bars with hatching rising to the left) represent a case where a comparison was made using large patterns (L&S patterns in the range of 500 nm to 100 nm) which were not so affected by the resolution limit. Under this condition, it is seen that, on the reflective mask blank, the CD linearity tends to be improved as the contrast value γ decreases. It is seen that the resists C, D, and E with the contrast value γ of 30 or less satisfy a CD linearity of 4.8 nm or less required for the DRAM hp32 nm of the design rule.

In FIG. 3, right-side bars for the respective resists represent a case where a comparison was made using L&S patterns in the range of 500 nm to 70 nm. Under this condition, it is seen that, on the reflective mask blank, the resists D and E with the contrast value γ of 25 or less fully satisfy a CD linearity of 3.4 nm or less required for the DRAM hp23 nm of the design rule.

Figure 4:
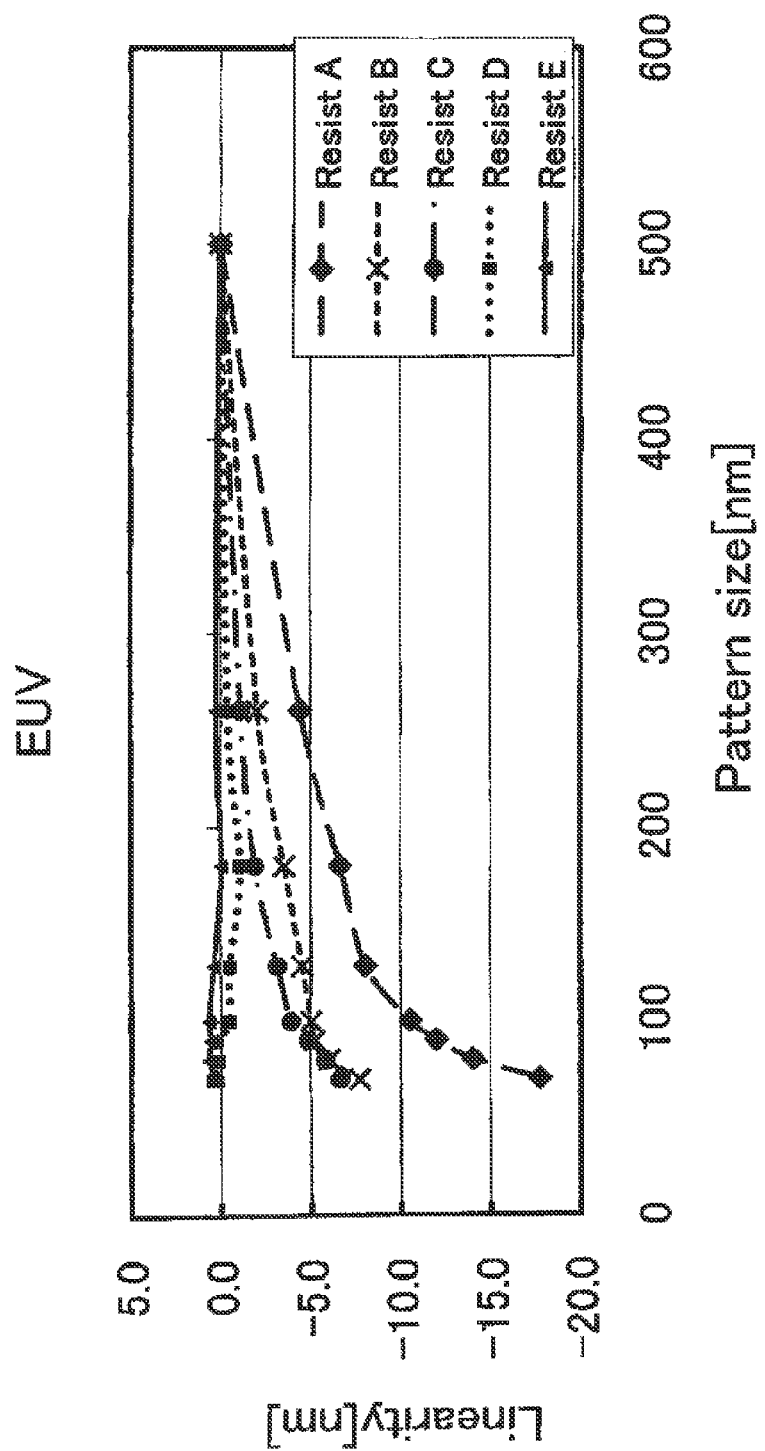
FIG. 4 is a diagram showing the CD linearity of chemically amplified resists A, B, C, D, and E in the range of 500 nm to 70 nm, each on a reflective mask blank.

FIG. 4 shows the relationship between the pattern size (nm) of a L&S pattern in the range of 500 nm to 70 nm and the CD linearity (nm) with respect to the chemically amplified resists A, B, C, D, and E.

Figure 5:
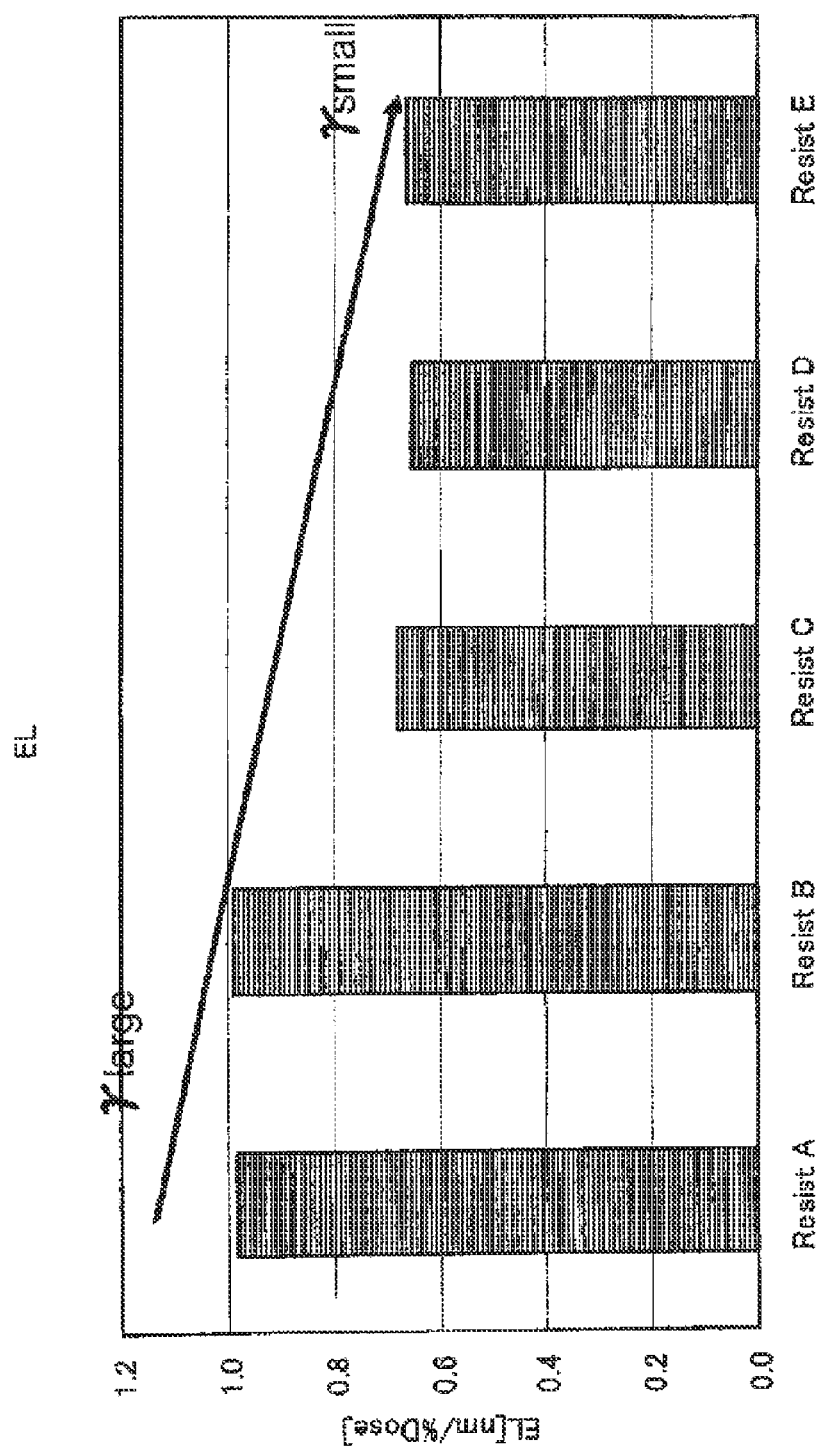
FIG. 5 is a diagram showing the exposure latitude EL of chemically amplified resists A, B, C, D, and E.

FIG. 5 shows the relationship between the chemically amplified resists A, B, C, D, and E and the exposure latitude EL (nm/% dose), wherein a comparison was made using a design pattern of 500 nm.

As shown in FIG. 5, there is a tendency that as the contrast values γ of the chemically amplified resists A, B, C, D, and E decrease, the values of the exposure latitude EL also decrease. According to this, it is seen that the resists C, D, and E satisfy the exposure latitude EL of 0.7 nm/% dose or less.

The chemically amplified resist A can resolve a hole pattern of 500 nm, but cannot resolve a hole pattern of 300 nm. The chemically amplified resist A can resolve a line-and-space (L&S) pattern of 70 nm, but cannot resolve a L&S pattern of 60 nm. In the chemically amplified resist A, the CD linearity of a resist pattern is 10.5 nm with respect to a L&S pattern in the range of 500 to 100 nm while the CD linearity of a resist pattern is 17.7 nm with respect to a L&S pattern in the range of 500 nm to 70 nm.

The chemically amplified resist B can resolve a hole pattern of 125 nm, but cannot resolve a hole pattern of 100 nm. The chemically amplified resist B can resolve a L&S pattern of 60 nm, but cannot resolve a L&S pattern of 50 nm. In the chemically amplified resist B, the CD linearity of a resist pattern is 5.0 nm with respect to a L&S pattern in the range of 500 to 100 nm while the CD linearity of a resist pattern in the range of 500 nm to 70 nm is 7.7 nm.

The chemically amplified resist C can resolve a hole pattern of 100 nm, but cannot resolve a hole pattern of 80 nm. The chemically amplified resist C can resolve a L&S pattern of 60 nm, but cannot resolve a L&S pattern of 50 nm. In the chemically amplified resist C, the CD linearity of a resist pattern is 3.9 nm with respect to a L&S pattern in the range of 500 to 100 nm while the CD linearity of a resist pattern in the range of 500 nm to 70 nm is 6.6 nm.

The chemically amplified resist D can resolve a hole pattern of 60 nm, but cannot resolve a hole pattern of 50 nm. The chemically amplified resist D can resolve a L&S pattern of 50 nm, but cannot resolve a L&S pattern of 45 nm. In the chemically amplified resist D, the CD linearity of a resist pattern is 1.1 nm with respect to a L&S pattern in the range of 500 to 100 nm while the CD linearity of a resist pattern in the range of 500 nm to 70 nm is 1.5 nm.

The chemically amplified resist E can resolve a hole pattern of 80 nm, but cannot resolve a hole pattern of 70 nm. The chemically amplified resist E can resolve a L&S pattern of 45 nm, but cannot resolve a L&S pattern of 40 nm. In the chemically amplified resist E, the CD linearity of a resist pattern is 0.7 nm with respect to a L&S pattern in the range of 500 to 100 nm while the CD linearity of a resist pattern in the range of 500 nm to 70 nm is 0.7 nm.

As described above, it is seen that as the contrast value $\gamma$ decreases, the resolution performance (minimum resolution size) is improved and the CD linearity is improved.

(Manufacture of Reflective Mask)

The above-mentioned resist films A to E for electron beam writing were respectively formed on the plurality of reflective mask blanks obtained above, then predetermined pattern writing was carried out using an electron beam writing apparatus, and then development was carried out after the pattern writing, thereby forming resist patterns in the same manner as described above.

Then, using each resist pattern as a mask, the uppermost layer and the lower layer of the absorber film were dry-etched using a chlorine gas, thereby forming the absorber film into a transfer pattern in the form of a laminated pattern of the lower layer and the uppermost layer.

Further, using a mixed gas of chlorine and oxygen, the buffer film remaining in a reflection area (portion with no pattern of the absorber film) was removed by dry etching according to the pattern of the absorber film, thereby exposing the multilayer reflective film having the Ru protective film on its surface. In this manner, reflective masks were obtained.

A final confirmation inspection of the obtained reflective masks was carried out and it was confirmed that a pattern of the DRAM hp23 nm generation of the design rule was formed as designed in the case of using the chemically amplified resist D or E. It was confirmed that a pattern of the DRAM hp32 nm generation of the design rule was formed as designed in the case of using the chemically amplified resist C. A pattern of the DRAM hp32 nm generation of the design rule could not be formed as designed in the case of using the chemically amplified resist A or B.

(Reference Example)

The above-mentioned resist films A and B for electron beam writing were respectively formed on a plurality of halftone phase shift mask blanks each having a Cr-based light-shielding film with a thickness of 48 nm on a MoSi-based phase shift film with a thickness of 69 nm, i.e. respectively formed on the Cr-based light-shielding films, then predetermined pattern writing was carried out using an electron beam writing apparatus, and then development was carried out after the pattern writing, thereby forming resist patterns. The acceleration voltage of an electron beam was set to 50 keV.

The above-mentioned resist film E for electron beam writing was formed on a binary mask blank having a MoSi-based light-shielding film with a thickness of 60 nm, i.e. formed on the MoSi-based light-shielding film, then predetermined pattern writing was carried out using an electron beam writing apparatus, and then development was carried out after the pattern writing, thereby forming a resist pattern. The acceleration voltage of an electron beam was set to 50 keV.

Figure 6:
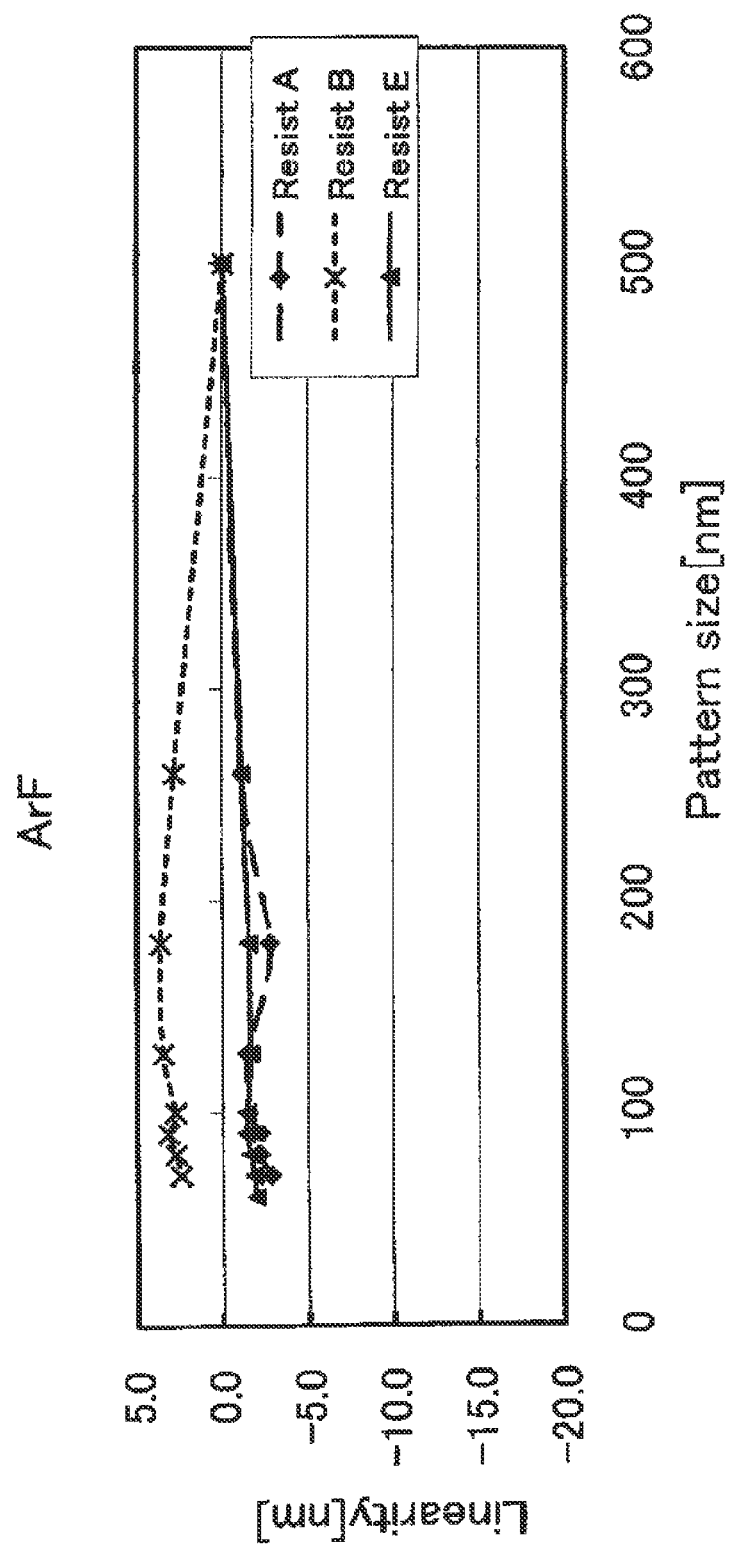
FIG. 6 is a diagram showing the CD linearity of chemically amplified resists A, B, and E in the range of 500 nm to 70 nm, each on a binary mask blank.

FIG. 6 shows the relationship between the pattern size (nm) of a L&S pattern in the range of 500 nm to 70 nm and the CD linearity (nm) with respect to the chemically amplified resists A, B, and E. In all the resists, the CD linearity (nm) is excellent in the range of 500 nm to 70 nm.

Figure 7:
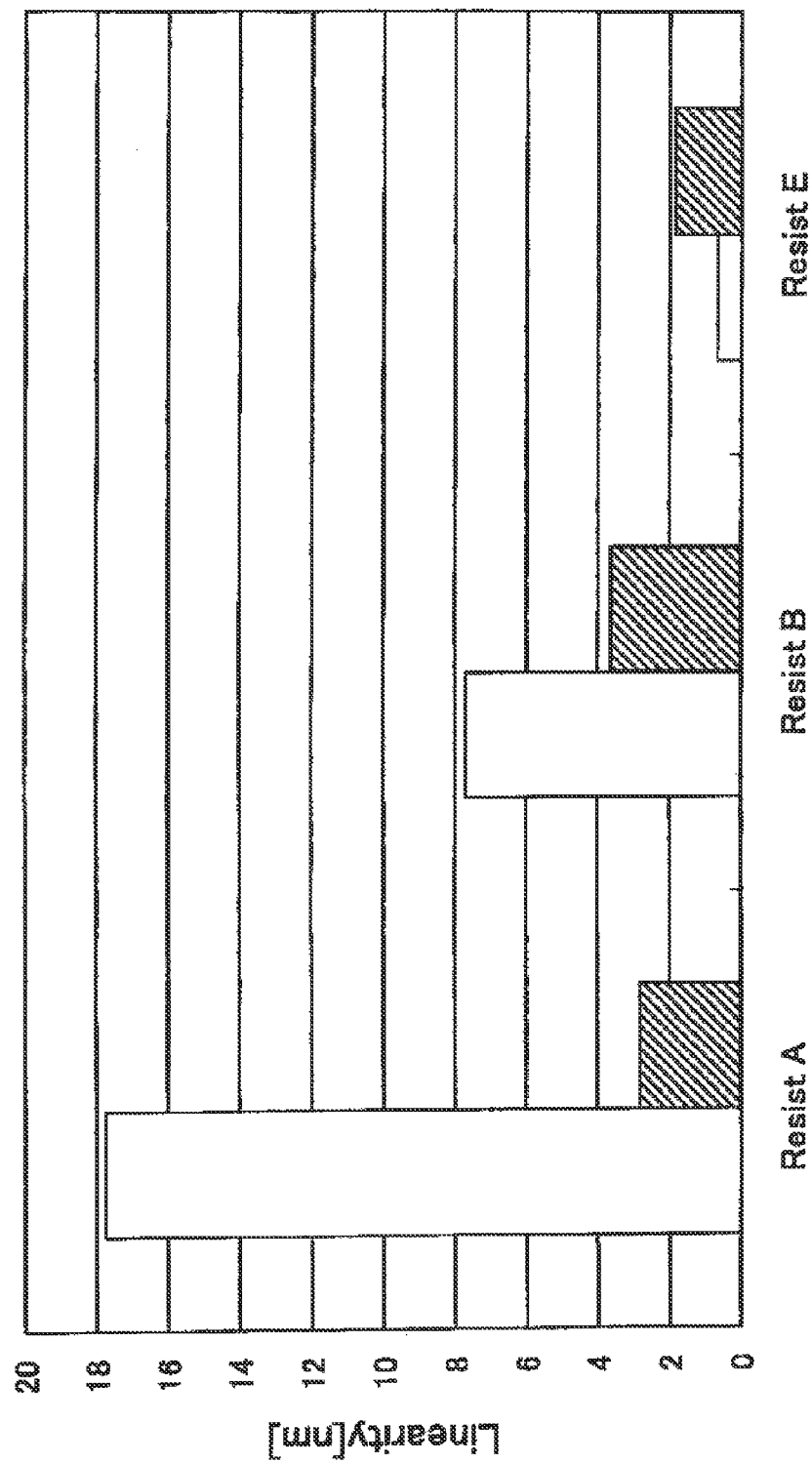
FIG. 7 is a diagram showing the CD linearity of chemically amplified resists A, B, and E each on a reflective mask blank and a binary mask blank.

In FIG. 7, a right-side bar for each resist (a bar with hatching rising to the right) shows the results of FIG. 6, i.e. the range of CD linearity (nm) in the range of 500 nm to 70 nm with respect to the resist pattern formed on the halftone phase shift mask blank or the binary mask blank. The CD linearities of the resists A, B, and E are 2.8 nm, 3.6 nm, and 1.8 nm, respectively, which are excellent.

In FIG. 7, a left-side bar for each resist shows the right-side bar in FIG. 3, i.e. the range of CD linearity (nm) in the range of 500 nm to 70 nm with respect to the resist pattern formed on the reflective mask blank.

From FIG. 7, it is seen that the chemically amplified resists A, B, and E each can obtain the excellent CD linearity if it is on the halftone phase shift mask blank or the binary mask blank, i.e. if it is not on the reflective mask blank. The degradation in CD linearity is a unique phenomenon on the reflective mask blank.

DESCRIPTION OF SYMBOLS 1 substrate
2 multilayer reflective film
3 buffer film
4 absorber film
4a lower layer
4b uppermost layer
5 resist film
10 reflective mask blank
20 reflective mask

The invention claimed is:

1. A reflective mask blank for manufacturing a reflective mask, comprising:
   a substrate;
   a multilayer reflective film which is formed on the substrate and adapted to reflect exposure light;
   an absorber film which is formed on the multilayer reflective film and adapted to absorb the exposure light; and
   a resist film for electron beam writing which is formed on the absorber film;
   wherein a contrast value $\gamma$ of the resist film is 30 or less.

2. The reflective mask blank according to claim 1, wherein the contrast value $\gamma$ of the resist film is 25 or less.

3. The reflective mask blank according to claim 1, wherein the reflective mask blank is used in EUV lithography which uses EUV light as exposure light.

4. The reflective mask blank according to claim 1, wherein the absorber film is made of a material containing tantalum.

5. The reflective mask blank according to claim 1, wherein the number of layers of the multilayer reflective film is 10 cycles or more.

6. The reflective mask blank according to claim 1, wherein the resist film is made of a chemically amplified resist.

7. A reflective mask manufactured by using the mask blank according to claim 1 and patterning the absorber film.

8. A reflective mask blank for manufacturing a reflective mask, comprising:
   a substrate;
   a multilayer reflective film which is formed on the substrate and adapted to reflect exposure light;
   an absorber film which is formed on the multilayer reflective film and adapted to absorb the exposure light; and
   a resist film for electron beam writing which is formed on the absorber film;
   wherein an exposure latitude of the resist film is 0.7 nm/% dose or less.

9. The reflective mask blank according to claim 8, wherein the contrast value γ of the resist film is 25 or less.

10. The reflective mask blank according to claim 8, wherein the reflective mask blank is used in EUV lithography which uses EUV light as exposure light.

11. The reflective mask blank according to claim 8, wherein the absorber film is made of a material containing tantalum.

12. The reflective mask blank according to claim 8, wherein the number of layers of the multilayer reflective film is 10 cycles or more.

13. The reflective mask blank according to claim 8, wherein the resist film is made of a chemically amplified resist.

14. A reflective mask manufactured by using the mask blank according to claim 8 and patterning the absorber film.

15. A method of manufacturing a reflective mask, comprising the steps of:
   preparing a reflective mask blank for manufacturing a reflective mask, the reflective mask blank comprising a substrate, a multilayer reflective film which is formed on the substrate and adapted to reflect exposure light, and an absorber film which is formed on the multilayer reflective film and adapted to absorb the exposure light, and a resist film for electron beam writing on the absorber film; and
   forming a resist pattern by the electron beam writing;
   wherein a contrast value γ of the resist film is 30 or less.

16. The method of manufacturing a reflective mask according to claim 15, wherein the contrast value γ of the resist film is 25 or less.

17. The method of manufacturing a reflective mask according to claim 15, wherein exposure is carried out at an acceleration voltage of an electron beam being 50 keV or more in the electron beam writing.

18. A method of manufacturing a reflective mask, comprising the steps of:
   preparing a reflective mask blank for manufacturing a reflective mask, the reflective mask blank comprising a substrate, a multilayer reflective film which is formed on the substrate and adapted to reflect exposure light, and an absorber film which is formed on the multilayer reflective film and adapted to absorb the exposure light, and a resist film for electron beam writing on the absorber film;
   and
   forming a resist pattern by the electron beam writing;
   wherein an exposure latitude of the resist film is 0.7 nm/% dose or less.

19. The method of manufacturing a reflective mask according to claim 18, wherein the contrast value γ of the resist film is 25 or less.

20. The method of manufacturing a reflective mask according to claim 18, wherein exposure is carried out at an acceleration voltage of an electron beam being 50 keV or more in the electron beam writing.

* * * * *